United States Patent [19]
Middleton et al.

[11] Patent Number: 6,101,573
[45] Date of Patent: Aug. 8, 2000

[54] BIT LINE AND/OR MATCH LINE PARTITIONED CONTENT ADDRESSABLE MEMORY

[75] Inventors: Peter Guy Middleton; John Stuart Kelly, both of Saffron Walden; Michael Thomas Kilpatrick, Cambridge, all of United Kingdom; Mark Allen Silla, Round Rock, Tex.

[73] Assignee: ARM Limited, Cambridge, United Kingdom

[21] Appl. No.: 09/096,523

[22] Filed: Jun. 12, 1998

[51] Int. Cl.[7] .............................. G06F 12/14; G06F 13/16
[52] U.S. Cl. .............................. 711/108; 711/163; 365/49
[58] Field of Search .................................. 711/108, 163; 365/49, 50

[56] References Cited

U.S. PATENT DOCUMENTS

| | | | |
|---|---|---|---|
| 5,485,418 | 1/1996 | Hiraki et al. | 365/49 |
| 5,777,944 | 7/1998 | Knaack et al. | 365/230.06 |
| 5,946,705 | 8/1999 | Cumming et al. | 711/108 |

*Primary Examiner*—Reginald G. Bragdon
*Attorney, Agent, or Firm*—Nixon & Vanderhye P.C.

[57] ABSTRACT

A cache memory 18 is formed of a content addressable memory 20 and a cache RAM 22. The content addressable memory 20 is divided into two or more sections by an AND gate array 28 that serves to selectively either block or unblock the bit lines 26 that supply an input data word to the bit storage and comparison cells 34 of the content addressable memory 20. The generation of match signals for each section is also selectively blocked by preventing the match signal discharge to ground. The match signals from a blocked section are not passed to the RAM 22. The AND gate array 28 and match signal disable may be controlled by the least significant bit of the input data word, higher order bits of the input data word or may be controlled by a bit selected by program control from among the bits of the input data word. When a portion of the bit lines 26 are blocked by the AND gate array 28, then the capacitance of the bit lines 26 that need to be driven is reduced and the number of match lines discharged is halved thereby reducing power consumption.

10 Claims, 6 Drawing Sheets

BIT LINE AND/OR MATCH LINE PARTITIONED CONTENT ADDRESSABLE MEMORY

BACKGROUND OF THE INVENTION

1. Field of the Invention

This invention relates to the field of data memories. More particularly, this invention relates to content addressable memories.

2. Description of the Prior Art

It is known to provide content addressable memories of the type illustrated in FIG. 1 of the accompanying drawings. FIG. 1 shows an example of a cache memory 2 including a content addressable memory 4 and an array of cache RAM 6. In operation, an input data word 8 is supplied at the data word input 10 of the content addressable memory. The input data word 8 comprises bits [31:5] of the address location of the data value (data or instruction) being sought. The input data word 8 is passed along the bit lines 12 through the content addressable memory 4 such that it is available to each of the rows of bit storage and comparison cells within the content addressable memory 4. Each row of bit storage and comparison cells compares the input data word with the data word it is storing and, if a match is detected, generates a match signal on a match line. This match signal indicates that the corresponding row within the cache RAM 6 contains the data being sought. The cache RAM 6 contains eight data words and the bits [4:2] in conjunction with a multiplexer 14 are used to select the data word for output from the cache RAM 6.

A discussion of this type of circuit may be found in the book "Principles of CMOS VLSI Design—A Systems Perspective", Second Edition, Neil H E Weste and Kamran Eshraghian, Section 8.3.3, page 589.

SUMMARY OF THE INVENTION

It is an object of the invention to provide a content addressable memory that consumes less power.

Viewed from one aspect the present invention provides a content addressable memory comprising:

(i) a plurality of rows of bit storage and comparison cells within an array of bit storage and comparison cells, each row storing a data word; and (ii) a plurality of bits lines running through said array between corresponding bit storage and comparison cells within adjacent rows for transmitting an input data word from a data word input at one point on said bit lines along said bit lines to each row coupled to said bit lines, said input data word being compared with a respective stored data word by each row to detect a match, that is indicated by a match signal upon a match line for that row; wherein (iii) said array is divided into at least two sections by one or more sets of gating circuits that operate to perform one or more of a) selectively blocking said input data word being transmitted along said bit lines beyond said gating circuits and b) selectively blocking generation of said match signals for at least one section; and (iv) said gating circuits being controlled to block or unblock in response to at least one bit of said input data word.

The present invention recognises that significant power consumption advantages can be achieved by partitioning the content addressable memory using gating circuits disposed in the bit lines running through the content addressable memory and/or disabling generation of match signal for a section of the content addressable memory. The sections of the content addressable memory thus formed can share their supporting circuitry, e.g. input circuitry, and so the modification requires only a small increase in circuit area through the provision of the gating circuits and their control and yet is able to provide a significant decrease in power consumption. Dividing the bit lines into sections has the result that when a portion of the bit line is blocked off by the gating circuit, then the capacitance of the bit line being driven is reduced. Reducing the capacitance decreases the amount of power consumed in changing the signal value on the bit line. Blocking generation of the match signals for a section also decreases power consumption as these are normally all precharged and then all that do not match are discharged.

Partitioning the content addressable memory in accordance with the invention reduces the associativity of the content addressable memory but in practice this is a small disadvantage compared to the approximate halving of the bit line capacitance and the blocking of the match signal generation that may be achieved when the gating circuits are blocking and the content addressable memory is divided into two roughly equally sized sections. In this example, if the gating circuits block off half of the bit lines half of the time, then the power consumption in the bit lines would be reduced to approximately 75% of the values for the unmodified circuit. This is a significant improvement.

It will be appreciated that the content addressable memory could be divided into more than two sections using more than one set of gating circuits. However, in preferred embodiments said array is divided into two sections by one row of gating circuits.

It has been found that the majority of the power consumption and speed benefits can be achieved whilst avoiding the introduction of potentially problematic propagation delays along the bit lines due to the gating circuits in embodiments in which only one row of gating circuits is used to divide the array into two sections.

Potential problems due to the reduction in associativity of the content addressable memory can be reduced in embodiments in which said gating circuits are controlled by a least significant bit of said input data word such that consecutive input data words are compared with a different one of either said section closest said data word input with said gating circuits blocked or both of said sections with said gating circuits unblocked.

In operation it is found that it is common for content addressable memories to store blocks of adjacent data values. Using the least significant bit of the input data word to select the section of the content addressable memory spreads such blocks evenly between the two sections thus ensuring the full capacity of the content addressable memory is properly utilised.

As an alternative it may also be advantageous in some circumstances that said gating circuits are controlled by a higher order bit than said least significant bit such that adjacent blocks of consecutive input data words are compared with a different one of either said section closest said data word input with said gating circuits blocked or both of said sections with said gating circuits unblocked.

Using a higher order bit to control the gating circuits makes it possible to ensure that a block of suitably address aligned data values can be arranged to be wholly stored within the low power consumption portion of the content addressable memory. If this block is data that is very frequency accessed, then the benefits of the invention may be increased by ensuring that this code is wholly within the low power consumption section. Additional care needs to be taken to ensure such code is properly address aligned and that the reduction in associativity does not cause the content addressable memory to have an insufficient capacity for this code that would more than negate the power consumption saving.

It will be appreciated that the power consumption benefits can be achieved if only some of the bit lines are selectively blocked. However, in preferred embodiments of the invention, said gating circuits extend across a complete row and selectively block or unblock all of said bit lines running between said sections.

The gating circuit may be simply and effectively formed by AND gates that have as their inputs a bit of the input data word propagating along the bit line and a bit of the data word that has been selected to control the blocking and unblocking of the gating circuit.

The present invention is particularly well suited for use within a cache memory where the content addressable memory stores cache TAG values.

It will be appreciated that whilst it is possible for the present invention to be implemented as discrete components, it is strongly advantageous that the invention is used within the context of an integrated circuit microprocessor.

Viewed from another aspect the present invention provides a method of operating content addressable memory having a plurality of rows of bit storage and comparison cells within an array of bit storage and comparison cells, each row storing a data word; and a plurality of bits lines running through said array between corresponding bit storage and comparison cells within adjacent rows for transmitting an input data word from a data word input at one point on said bit lines along said bit lines to each row coupled to said bit lines, said input data word being compared with a respective stored data word by each row to detect a match that is indicated by a match signal on a match line for that row and said array being divided into at least two sections by one or more sets of gating circuits; said method comprising:

(i) selectively blocking one or more of a) said input data word being transmitted along said bit lines beyond said gating circuits within said bit lines that divide said array into at least two sections and b) generation of said match signals for at least one section of said array using said gating circuits; and (ii) controlling said gating circuit to block or unblock in response to at least one bit of said input data word.

The above, and other objects, features and advantages of this invention will be apparent from the following detailed description of illustrative embodiments, which is to be in connection with the accompanying drawings.

DESCRIPTION OF THE PREFERRED EMBODIMENTS

Figure 2:
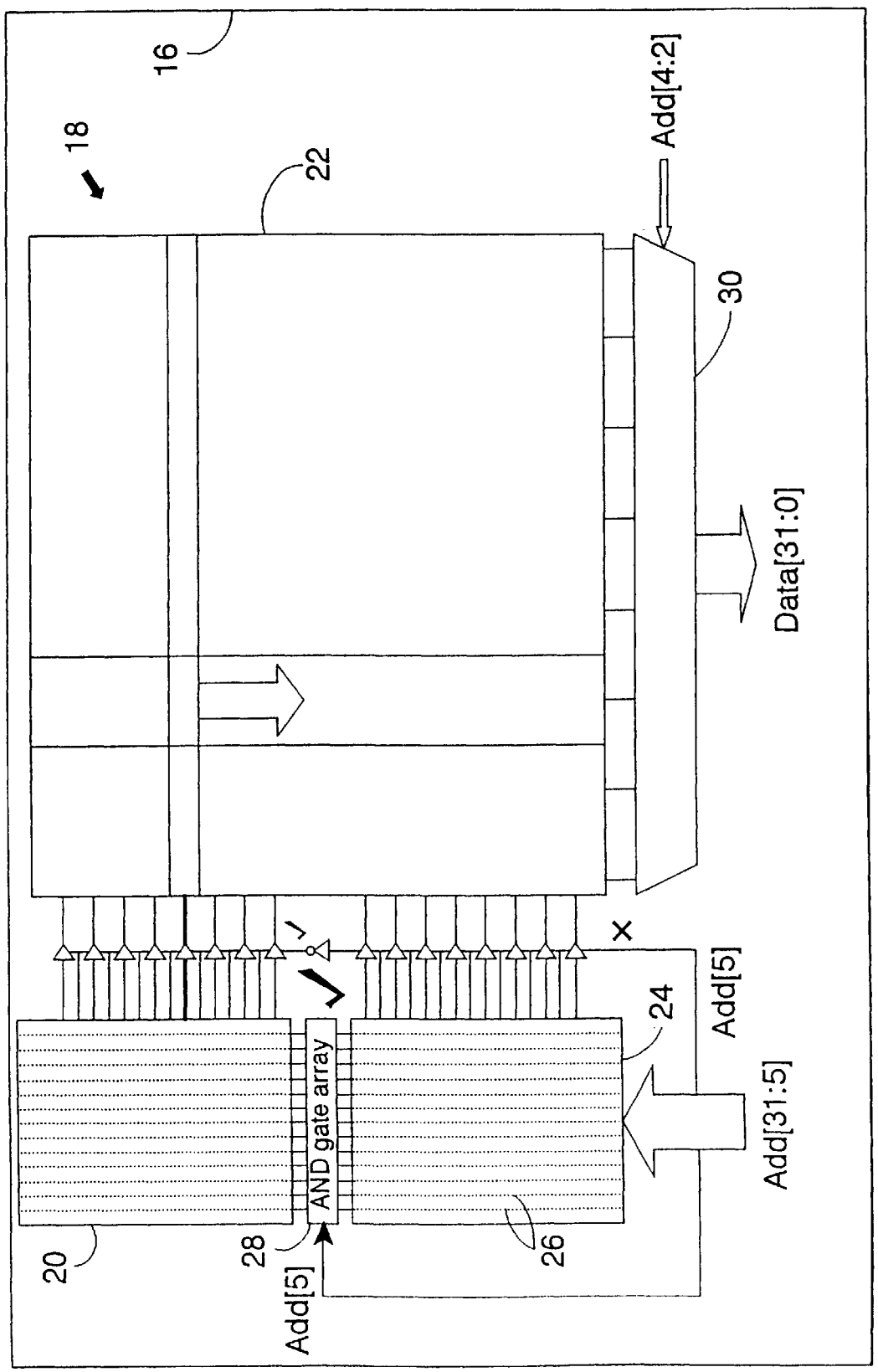
FIG. 2 illustrates a content addressable memory in accordance with a first embodiment of the invention.

FIG. 2 schematically shows a microprocessor 16 containing a cache memory 18 (the many other parts of the microprocessor are omitted for clarity). The cache memory 18 is formed of a content addressable memory 20 and a cache RAM 22. The content addressable memory 20 has a single data word input 24 through which address bit values [31:5] are passed along bit lines 26 to reach the rows of bit storage and comparison cells.

A row of AND gates 28 (or any circuit that performs an AND function) is disposed half way along the bit lines 26 and serves to block signal propagation along the bit lines in dependence upon the least significant bit [5] of the input data word. In the case illustrated in FIG. 2, the controlling bit [5] is a "1" and so the AND gate array is conductive allowing the signals to propagate along the full length of the bit line 26 and reach all of the rows within the content addressable memory 20.

Figure 1:
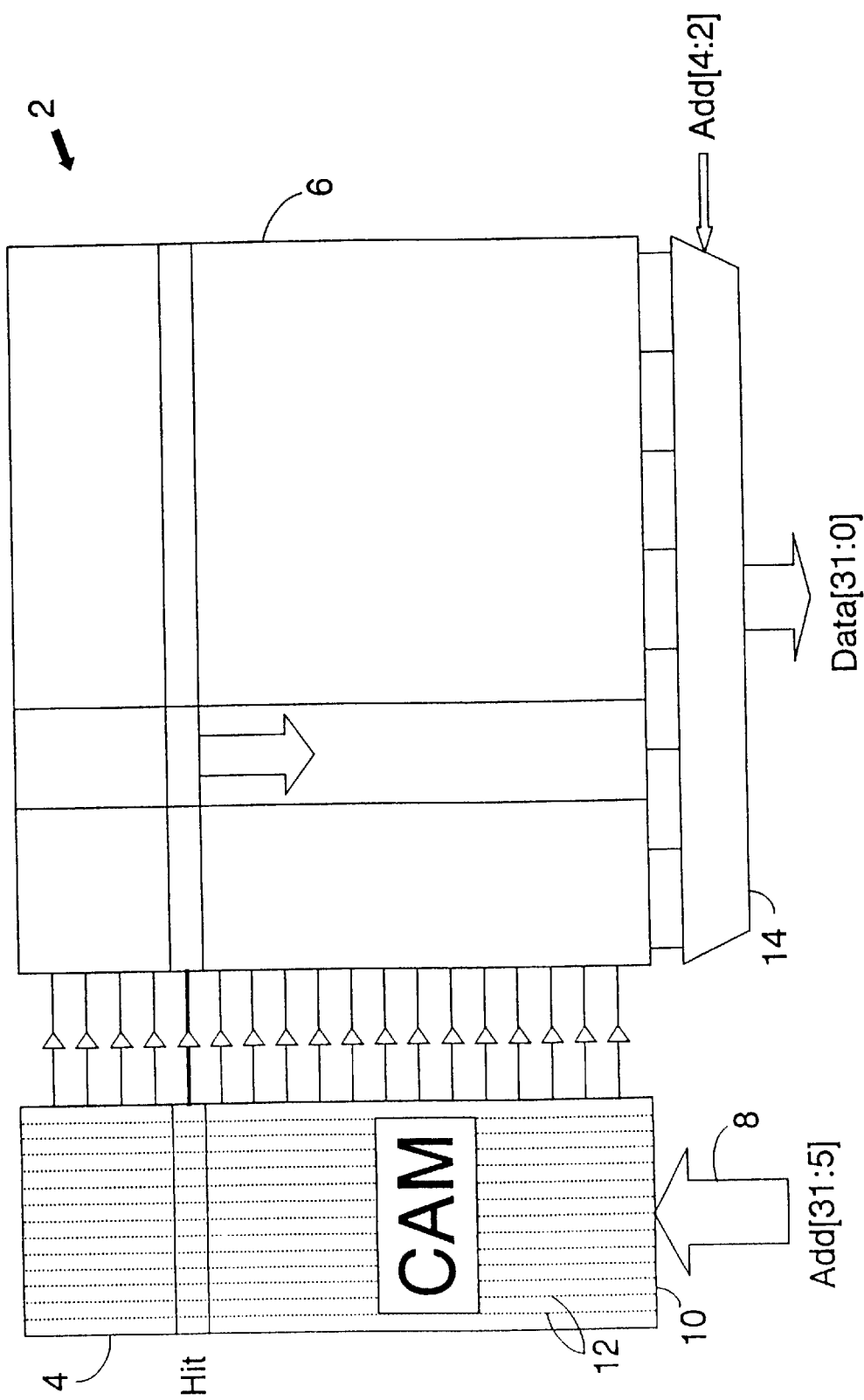
FIG. 1 illustrates a known content addressable memory.

When a hit is detected, this gives rise to a hit signal that is passed to one of the row drivers within the cache RAM 22 to trigger read out of a data word via the multiplexer 30 in a manner similar to that previously described for FIG. 1. The row drivers for each section are also selectively enabled by bit [5] such that if a section is blocked off, then its match line row drivers are disabled. The same signal also disables the discharge to ground of all the match lines within the blocked off CAM section that would normally occur.

Figure 3:
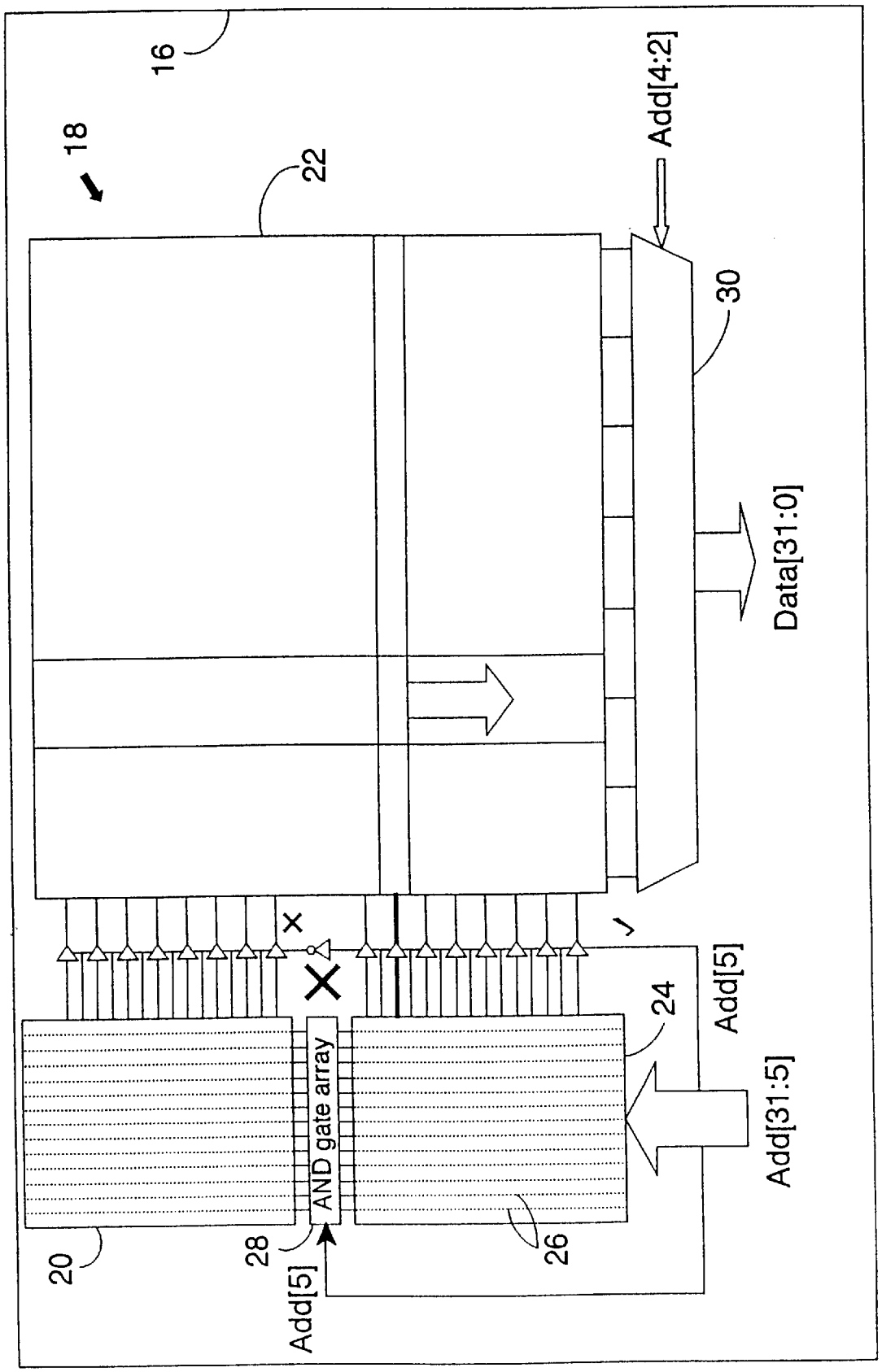
FIG. 3 illustrates the embodiment of FIG. 2 with the gating circuits blocking the bit lines.

FIG. 3 shows the embodiment of FIG. 2, but in this case the controlling bit [5] is a "0" renders the AND gate array 28 non-conductive. In this situation the input data word bits [31:5] only propagate along the portion of the bit lines 26 that is closest to the data word input 24. If a match occurs within this portion (section), then a match signal is issued and a data word read from the cache RAM 22.

Figure 4:
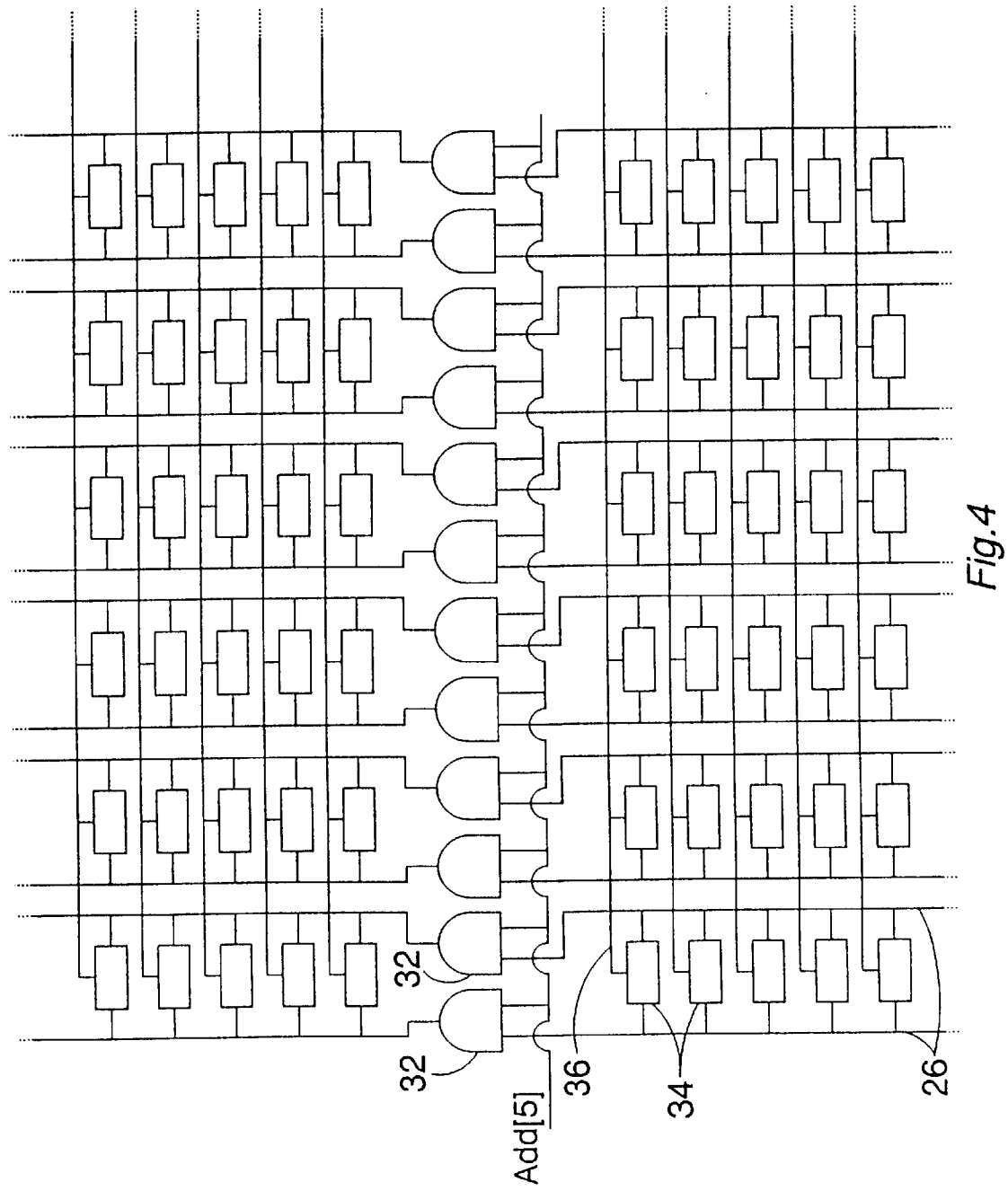
FIG. 4 illustrates the gating circuits in more detail.

FIG. 4 illustrates the gating circuits in more detail. The gating circuits comprise AND gates 32 disposed in a row across all of the bit lines 26. If the controlling bit [5] is a "1", then the AND gates 32 will pass the bit line signals. If the controlling bit [5] is a "0", then the AND gates 32 will block the bit line signals.

The bit lines 26 are coupled to bit storage and comparison cells 34 that are arranged in rows. Each row has a hit signal line 36 that issues a match signal if the contents of all of the bit storage and comparison cells within that row match the input data word.

Figure 5:
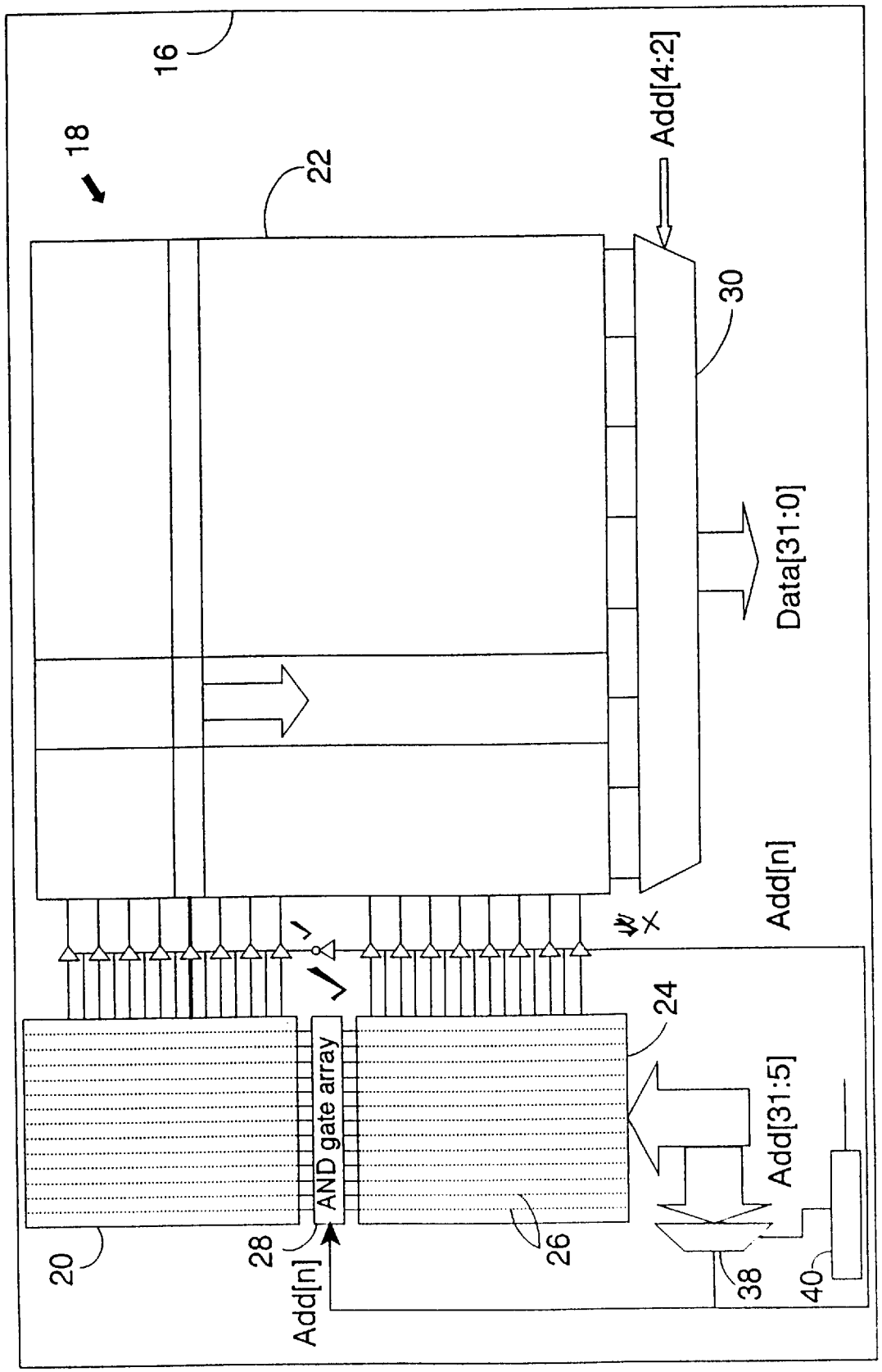
FIG. 5 illustrates a second embodiment of the invention.

FIG. 5 illustrates a second embodiment of the invention. In this embodiment, the controlling bit [n] that is used to unblock the AND gate array 28 is selected from within the input data word bits [31:5] by a multiplexer 38 that in turn is switched by the contents of a programmable register 40.

Using the arrangement of FIG. 5, a programmer may decide the way in which the content addressable memory 20 is to be partitioned in dependence upon the input data word. The register 40 could store a value that causes the multiplexer 38 to select the least significant bit of the input data word and so produce a system that operates in the same way as that of FIGS. 2 and 3. Alternatively, a higher order bit value may be chosen to be the controlling bit and in this case blocks of adjacent input data words would be found within one of the sections of the content addressable memory. If frequently accessed data words are arranged to be stored within the lower power consumption portion (the portion nearest the data word input 24) of the content addressable memory 20, then an increased overall power efficiency benefit may be achieved. Care is needed in the way in which the code is aligned within the memory in such cases.

Figure 6:
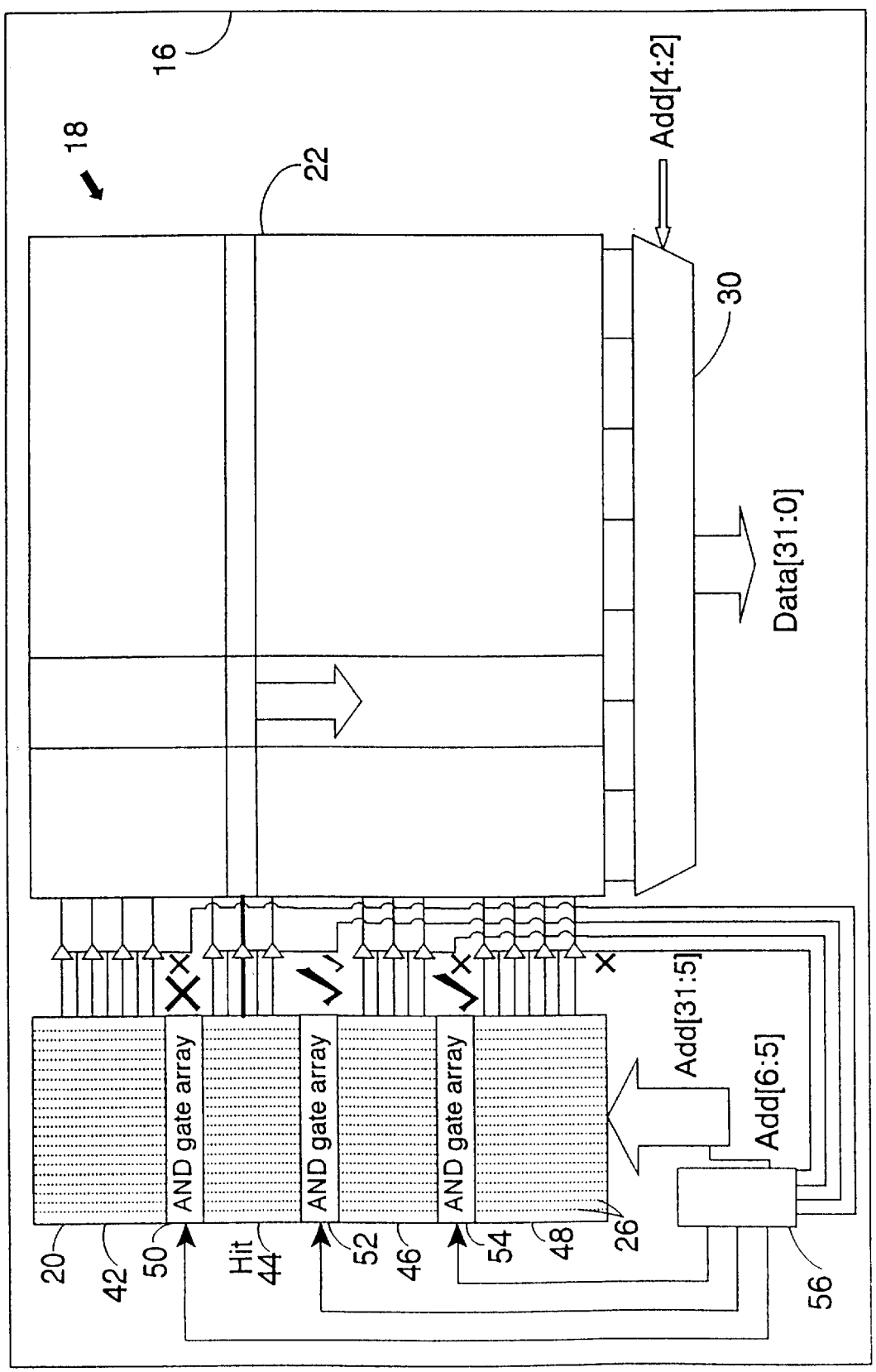
FIG. 6 illustrates a third embodiment of the invention.

FIG. 6 illustrates a third embodiment. In this case the content addressable memory 20 is divided into four sections 42, 44, 46 and 48. Each of these sections is divided from its neighbours by an AND gate array 50, 52 and 54.

In order to control the three AND gate arrays 50, 52 and 54, two bits [6:5] of the input data word bits [31:5] are needed. These controlling bits [6:5] are supplied to a decoder 56 that makes sections (48), (48 and 46) (48, 46 and 44) or (48, 46, 44 and 42) connected to the bit lines 26 in dependence upon whether the controlling bit values [6:5] are "00", "01", "10" or "11" respectively. The decoder 56 also blocks the row drivers and inhibits match signal generation (by isolating the ground for the match line) for each non-selected section with only one section being selected.

In the example illustrated in FIG. 6, the controlling bit values are "10" with the AND gate arrays 54, 52 being conductive whilst the AND gate array 50 is nonconductive. In this case, a hit has occurred within the section 44.

The victim selection circuitry that picks the position of a value being written into the content addressable memory 20 is responsive to the same bit or bits of the input data word as the gating circuits 50, 52, 54 in order to place the new value into a section of the content addressable memory 20 that will be coupled to the bit lines 26 when it is desired to read that value.

Although illustrative embodiments of the invention have been described in detail herein with reference to the accompanying drawings, it is to be understood that the invention is not limited to those precise embodiments, and that various changes and modifications can be affected therein by one skilled in the art without departing from the scope and spirit of the invention as defined by the appended claims.

I claim:

1. A content addressable memory comprising:
   (i) a plurality of rows of bit storage and comparison cells within an array of bit storage and comparison cells, each row storing a data word; and
   (ii) a plurality of bits lines running through said array between corresponding bit storage and comparison cells within adjacent rows for transmitting an input data word from a data word input at one point on said bit lines along said bit lines to each row coupled to said bit lines, said input data word being compared with a respective stored data word by each row to detect a match, that is indicated by a match signal upon a match line for that row; wherein
   (iii) said array is divided into at least two sections by one or more sets of gating circuits that operate to perform one or more of a) selectively blocking said input data word being transmitted along said bit lines beyond said gating circuits and b) selectively blocking generation of said match signals for at least one section; and
   (iv) said gating circuits being controlled to block or unblock in response to at least one bit of said input data word.

2. A content addressable memory as claimed in claim 1, wherein said array is divided into two sections by said gating circuits.

3. A content addressable memory as claimed in claim 2, wherein when said gating circuits selectively block said bit lines said gating circuits are controlled by a least significant bit of said input data word such that consecutive input data words are compared with a different one of either said section closest said data word input with said gating circuits blocked or both of said sections with said gating circuits unblocked.

4. A content addressable memory as claimed in claim 2, wherein when said gating circuits selectively block said bit lines said gating circuits are controlled a higher order bit than said least significant bit such that adjacent blocks of consecutive input data words are compared with a different one of either said section closest said data word input with said gating circuits blocked or both of said sections with said gating circuits unblocked.

5. A content addressable memory as claimed in claim 1, wherein said at least one bit of said input data word that controls said gating circuit is selected under programmable control.

6. A content addressable memory as claimed in claim 1, wherein said gating circuits extend across a complete row and selectively block or unblock all of said bit lines running between said sections.

7. A content addressable memory as claimed in claim 1, wherein said gating circuit comprise AND gates.

8. A cache memory including a content addressable memory as claimed in claim 1, wherein said content addressable memory stores cache TAG values.

9. An integrated circuit microprocessor including a content addressable memory as claimed in claim 1.

10. A method of operating content addressable memory having a plurality of rows of bit storage and comparison cells within an array of bit storage and comparison cells, each row storing a data word; and a plurality of bits lines running through said array between corresponding bit storage and comparison cells within adjacent rows for transmitting an input data word from a data word input at one point on said bit lines along said bit lines to each row coupled to said bit lines, said input data word being compared with a respective stored data word by each row to detect a match that is indicated by a match signal on a match line for that row and said array being divided into at least two sections by one or more sets of gating circuits; said method comprising:
   (i) selectively blocking one or more of a) said input data word being transmitted along said bit lines beyond said gating circuits that divide said array into at least two sections and b) generation of said match signals for at least one section of said array using said gating circuits; and
   (ii) controlling said gating circuit to block or unblock in response to at least one bit of said input data word.

* * * * *